United States Patent [19]

Pierrat

[11] Patent Number: 5,780,187

[45] Date of Patent: Jul. 14, 1998

[54] REPAIR OF REFLECTIVE PHOTOMASK USED IN SEMICONDUCTOR PROCESS

[75] Inventor: Christophe Pierrat, Boise, Id.

[73] Assignee: Micron Technology, Inc., Boise, Id.

[21] Appl. No.: 806,191

[22] Filed: Feb. 26, 1997

[51] Int. Cl.⁶ .................................................. G03F 9/00
[52] U.S. Cl. ........................................ 430/5; 430/324
[58] Field of Search ........................... 430/5, 312, 313, 430/314, 322, 323, 324

[56] References Cited

U.S. PATENT DOCUMENTS

| 5,244,759 | 9/1993 | Pierrat | 430/5 |
| 5,246,799 | 9/1993 | Pierrat | 430/5 |
| 5,246,801 | 9/1993 | Pierrat | 430/5 |
| 5,286,581 | 2/1994 | Lee | 430/5 |
| 5,338,626 | 8/1994 | Garofalo et al | 430/5 |
| 5,429,896 | 7/1995 | Hasegawa et al. | 430/5 |
| 5,455,131 | 10/1995 | Kang et al. | 430/5 |

*Primary Examiner*—S. Rosasco
*Attorney, Agent, or Firm*—Steven P. Koda

[57] ABSTRACT

A reflective photomask is fabricated enabling photolithographic processes at wavelengths as low as 100 nm, with preferred embodiments enabling processes at wavelengths of 150–200 nm. Reflective photomask defects of the type where material is missing are repaired by locally depositing material over the defective area. The deposit area is then trimmed, if needed, to remove excess material. The deposited material has substantially the same reflectivity and phase as the adjacent mask area. Chemical-mechanical polishing (CMP) or another planarizing process is used to smooth the defect area with the deposited material. The planarizing process prevents height differentials or border variations on the mask surface between the region where the material is deposited and the surrounding regions.

14 Claims, 3 Drawing Sheets

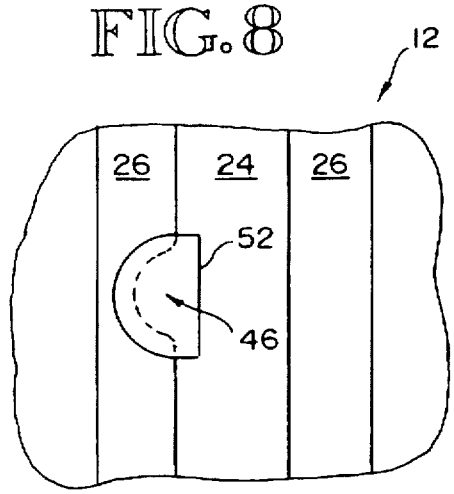
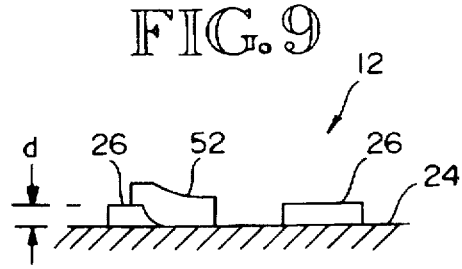
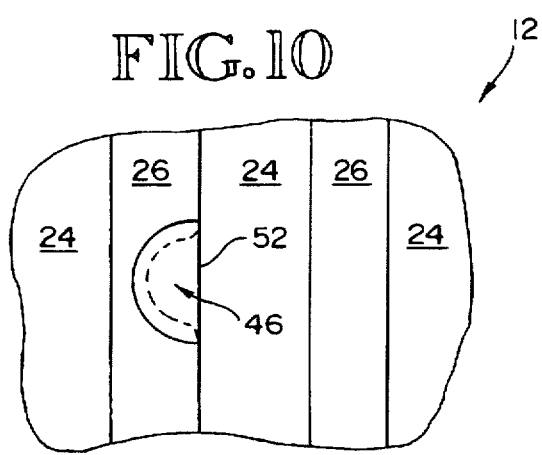
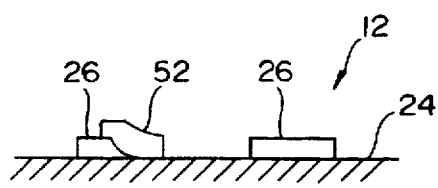
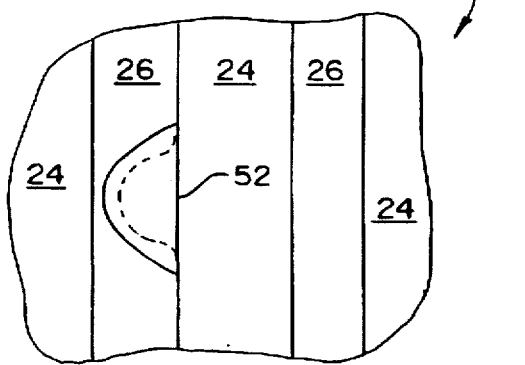
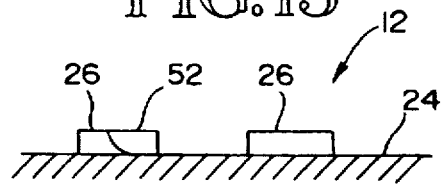

REPAIR OF REFLECTIVE PHOTOMASK USED IN SEMICONDUCTOR PROCESS

BACKGROUND OF THE INVENTION

This invention relates to photomasks used in the fabrication of semiconductor devices, and more particularly to the repair of a reflective photomask.

Semiconductor devices, also called integrated circuits, are mass produced by fabricating hundreds of identical circuit patterns on a single semiconductor wafer. During the process, the wafer is sawed into identical dies or "chips". Although commonly referred to as semiconductor devices, the devices are fabricated from various materials, including conductors (e.g., aluminum, tungsten), non-conductors (e.g., silicon dioxide) and semiconductors (e.g., silicon).

Within an integrated circuit thousands of devices (e.g., transistors, diodes) are formed. The integrated circuit devices with their various conductive layers, semiconductive layers, insulating layers, contacts and interconnects are formed by fabrication processes, including doping processes, deposition processes, photolithographic processes, etching processes and other processes. The term "photolithographic process" is of significance here, and refers to a process in which a pattern is delineated in a layer of material (e.g., photoresist) sensitive to photons, electrons or ions. The lithographic principle is similar to that of a photocamera in which an object is imaged on a photosensitive emulsion film. While with a photo-camera the "final product" is the printed image, the image in the semiconductor process context typically is an intermediate pattern which defines regions where material is deposited or removed. By successively imaging pattern layers on the semiconductor wafer, complex circuit layouts are defined. The various steps superimpose a number of insulator, conductor and semiconductor layers which define the thousands of semiconductor devices.

A typical photolithographic system includes a light source, optical system and transparent photomask. The light source emits light through the optical system and photomask onto a photoresist layer of a semiconductor wafer. The photomask defines the "intermediate pattern" used for determining where photoresist is to be removed or left in place. In the evolution of semiconductor processing, there has been a steady increase in the number of transistors fabricated onto a chip. Such increase has occurred by shrinking horizontal and vertical device geometries. The minimum line width and line separation printed onto the semiconductor wafer for a given geometry determines the number of devices that can be fabricated on a chip (and also directly impacts the circuit speed).

Conventional photolithographic processes include G-line lithography and I-line lithography. These names refer to the high-intensity lines in the output spectrum of a high pressure mercury arc source. The G-line process refers to light at 436 nm and is used to achieve feature sizes down to approximately 0.8 microns. The I-line process refers to light at 365 nm and is used to achieve feature sizes down to approximately 0.4 to 0.8 microns. The smaller the wavelength of the light source, the smaller the achievable line widths and line spacings, and correspondingly the higher the achievable device density per chip. As the implemented light wavelength decreases, the photomask patterns need to be more precisely laid out to image the desired smaller line widths and line spacings on the semiconductor wafer. Accordingly there is a need for fabricating photomasks for use with lithographic sources of decreasing wavelength.

Conventional photomasks are transparent masks. Transparent photomasks typically include a transparent plate or "blank" covered with a patterned film of opaque material. Conventional materials for the blank include soda lime, borosilicate glass or fused silica. One advantage of quartz is that it is transparent to wavelengths less than 365 nm and has a low thermal coefficient of expansion. Quartz begins absorbing light at approximately 193 nm. The film of opaque material typically is a film of chrome less than 100 nm thick and covered with an anti-reflective coating such as chrome oxide. The purpose of the anti-reflective coating is to suppress ghost images from the light reflected by the opaque material.

Transparent photomasks for imaging decreasingly small line widths need to meet stringent requirements for flatness, accuracy of pattern placement, minimum feature size, line width control over the entire mask area, and defect density. Conventionally, up to 75% of electron-beam generated masks may be defective and require repair. Typical transparent photomask defects result from (i) missing chrome, (ii) pinholes in the chrome layer, or (iii) regions of unresolved chrome.

The subject invention is addressed to a different type of photomask and a method for repairing such a photomask.

SUMMARY OF THE INVENTION

According to the invention, a reflective photomask is fabricated enabling photolithographic processes at wavelengths as low as 100 nm, with preferred embodiments enabling processes at wavelengths of 150–200 nm.

According to one aspect of the invention, reflective photomask defects of the type where material is missing are repaired by locally depositing material over the defective area. The area is then trimmed, if needed, to remove excess material.

According to another aspect of the invention, the deposited material has substantially the same reflectivity and phase as the adjacent mask area.

According to another aspect of the invention, chemical-mechanical polishing (CMP) or another planarizing process is used to smooth the defect area with the deposited material. The planarizing process is used to avoid height differentials or border variations on the mask surface in the region where the material is deposited.

A method for repairing a reflective photomask having an indentation where material is missing, includes depositing material of substantially the same reflectivity and phase response as the photomask into the indentation. The deposit area then is planarized to achieve a common surface profile between the deposited material and the adjacent photomask area.

One advantage of this invention is that the reflectivity and phase of the previously defective area is repaired to substantially match that of the surrounding mask area. Thus, the repaired mask is effective for imaging patterns onto the wafer at desired line widths and line spacings.

These and other aspects and advantages of the invention will be better understood by reference to the following detailed description taken in conjunction with the accompanying drawings.

3

Figure 2:
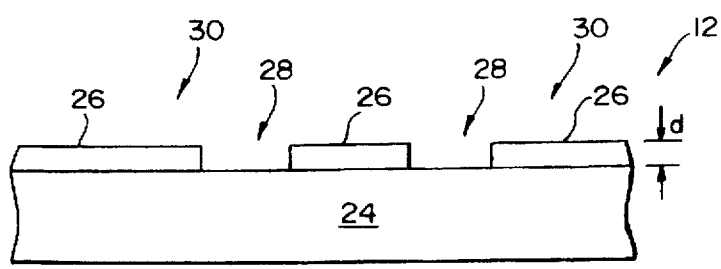
Figure 3:
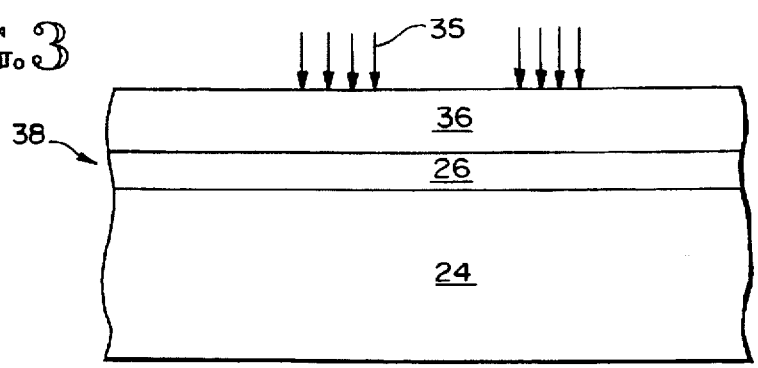
Figure 4:
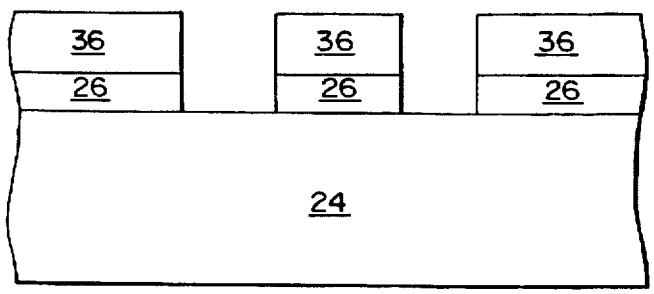
Figure 5:
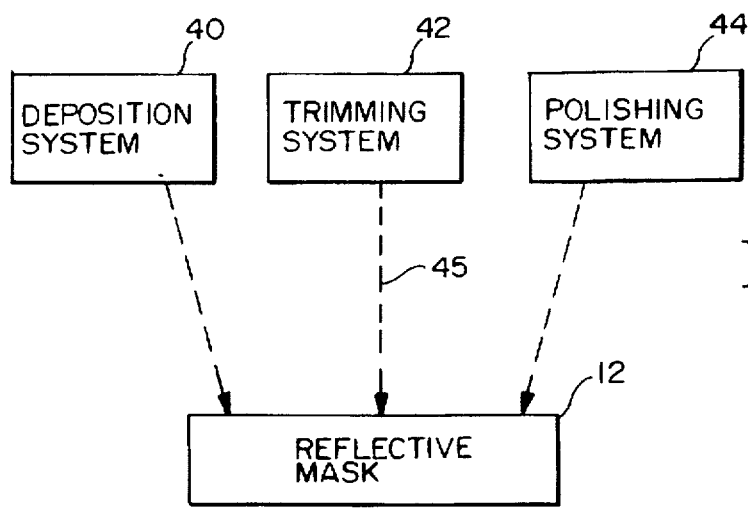
Figure 6:
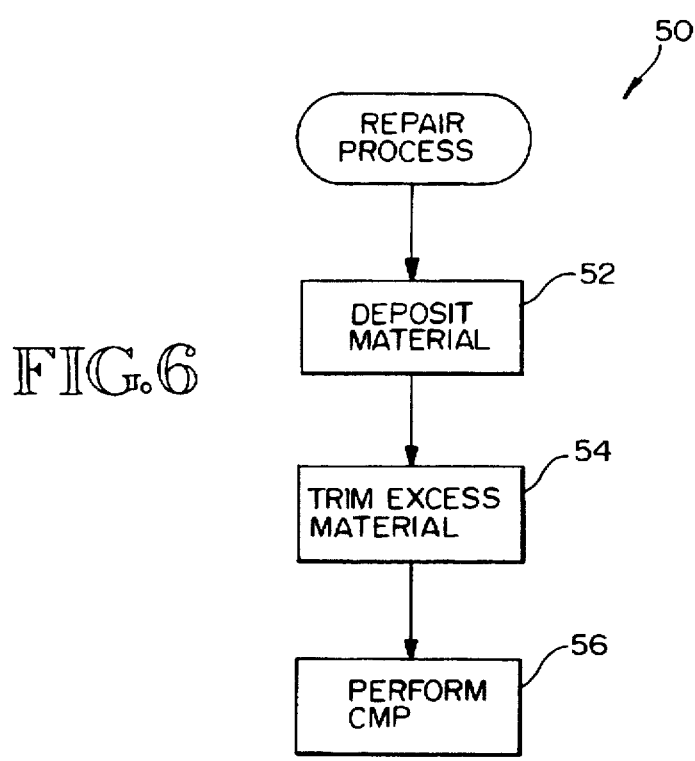
Figure 7:
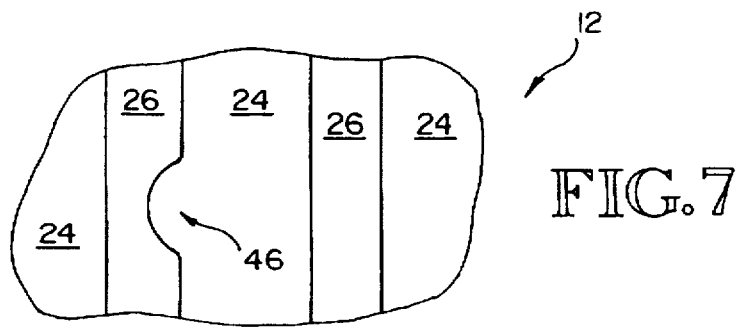

FIG. 2 is a partial view of a reflective photomask;

FIG. 3 is a partial view of the reflective photomask of FIG. 2 prior to etching and removal of a resist layer;

FIG. 4 is a partial view of the in-process reflective photomask of FIG. 3 after development of the resist and etching of portions of the first layer;

FIG. 5 is a block diagram of a system for repairing a defective photomask;

FIG. 6 is a flow chart of a method for repairing a defective reflective photomask according to an embodiment of this invention;

FIG. 7 is a top view of a portion of a defective reflective photomask;

FIG. 8 is a top view of the reflective photomask portion of FIG. 7 after receiving deposited material;

FIG. 9 is a cross sectional view of the reflective photomask portion of FIG. 8;

FIG. 10 is a top view of the reflective photomask portion of FIG. 8 after the deposited material is trimmed;

FIG. 11 is a cross sectional view of the reflective photomask portion of FIG. 10;

FIG. 12 is a top view of the reflective photomask portion of FIG. 10 after being planarized; and FIG. 13 is a cross sectional view of the reflective photomask portion of FIG. 12.

DESCRIPTION OF SPECIFIC EMBODIMENTS

Lithographic System and Photomask Overview

Figure 1:
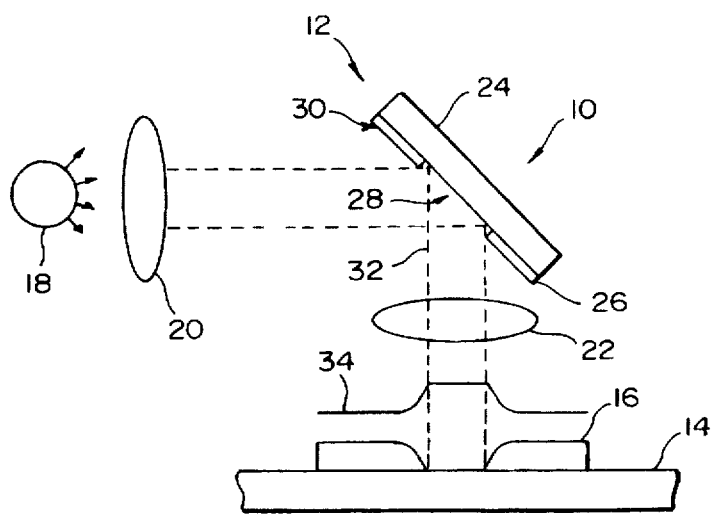
FIG. 1 is a block diagram of a lithographic system using a reflective photomask according to an embodiment of this invention.

FIG. 1 shows a block diagram of a lithographic system 10 using a reflective photomask 12 to generate patterns on a semiconductor wafer 14 via a photoresist layer 16. A light source 18 emits light at a prescribed wavelength into a condenser lens 20. The lens 20 converges the light toward the photomask 12. The reflective photomask 12 receives the converging light and reflects the light toward the substrate 14 and photoresist 16.

Referring to FIG. 2, the photomask 12 is formed by a substrate 24 and layers 26. The substrate 24 and layers 26 are of differing reflectivity. In a preferred embodiment the layers 26 have a thickness d sufficient to make the reflectivity of the layers 26 independent of thickness. In one embodiment, the substrate 24 is formed of a reflective material, while the layer 26 is formed of an opaque material. In another embodiment, the substrate is formed of the opaque material and the layers 26 are formed of the reflective material.

The layout of the layers 26 on the substrate 24 defines pattern features. For the embodiment in which the substrate is reflective and the layers 26 are opaque, light impinging on the photomask 12 is reflected at areas 28 where the substrate 24 is exposed, and is absorbed at areas 30 where the substrate 24 is covered by the opaque layer 26. The reflected light 32 travels through an objective lens 22 which focuses the light at the photoresist 16 surface. Portions of the photoresist layer 16, as defined by the photomask pattern, are exposed while other portions are left unexposed. The reflected light pattern 34 is shown in FIG. 1 for purposes of illustration. Depending on whether the photoresist 16 is positive or negative, once subjected to a development process (e.g., wet etching), either the exposed or the unexposed portion of the photoresist layer 16 is removed. The net effect is that the mask pattern is transferred to the photoresist layer 16. Subsequently, an etching process (e.g., dry etching or wet etching) is used to remove selected portions of the substrate and/or layer(s) (not shown) between the substrate 14 and the photoresist 16. Alternatively or thereafter an implantation process and deposition lift-off process are used to define a desired geometry for a substrate or substrate assembly.

When characterizing a portion of the mask 12 as being reflective or opaque, it is meant that the respective portion

4

24/26 is reflective or opaque at the wavelength of the impinging light 32. In exemplary embodiments, light having a wavelength of 100-250 nm or more is received. Such wavelengths enable patterning of submicron line widths and line spacings. For example, at 193 nm line widths and spacings of 0.18 microns are achieved. At 248 nm line widths and line spacings of 0.25 microns are achieved. In a specific embodiment light having a wavelength within the range of 150-200 nm is used. For light at approximately 160-170 nm a quartz substrate defines a reflective surface. At wavelengths longer than approximately 193 nm quartz is transparent and another material is preferred. One preferred reflective material at 150 nm wavelengths is aluminum. Another preferred reflective material at 150 nm is silicon. At 150 nm aluminum has a refractive index of 0.067 an absorbtion of 1.59 and a reflectivity of 86%. At 150 nm silicon has a refractive index of 0.444, an absorbtion of 1.9 and a reflectivity of 69%. An exemplary opaque material is lithium niobiate ($LiNbO_3$). At 150 nm $LiNbO_3$ has a refractive index of 1.58, an absorbtion of 0.46 and a reflectivity of 8%.

Reflective Photomask Fabrication

To fabricate the reflective photomask 12 a first layer 26 is deposited onto a substrate 24. A resist layer 36 is deposited onto the first layer 26. A lithography process then is performed to expose a portion of the resist layer 36. Referring to FIG. 3, light 37 impinges onto an in-process assembly 38 of the substrate 24, first layer 26 and resist layer 36. The light impinges onto some portions of the resist layer 36, while being masked to prevent impingement onto other portions of the resist layer 36. In various embodiments the impinging light is an electron beam or is in the ultraviolet range.

Depending on whether the resist layer 36 is positive or negative, either the exposed or the unexposed portion of the resist layer 36 is removed during development of the resist layer 36. As shown in FIG. 4, an etching process then is performed to remove the uncovered portions of the first layer 26. An etch resist process then is performed at the uncovered portions of the first layer 26 to remove such first layer portions and expose the substrate 24. A resist etching process then is performed to remove the remaining resist layer 36 portions covering the remaining first layer 26 portions. The result is a photomask 12 as shown in FIG. 2. In one embodiment, the substrate 24 is formed of a reflective material, while the first layer 26 is formed of an opaque material. In another embodiment, the substrate 24 is formed of the opaque material and the first layer 26 is formed of the reflective material. In alternative embodiments the substrate is formed by multiple layers of material (e.g., reflective materials in one embodiment; opaque materials in a different embodiment). In still other embodiments the first layer is formed instead by multiple layers (e.g., opaque materials in one embodiment; reflective materials in another embodiment).

Repair of a Defective Reflective Photomask

FIG. 5 shows respective deposition trimming and polishing systems 40, 42, 44 used in repairing a defective photomask 12. FIG. 6 shows a flow chart of the repair process according to an embodiment of this invention for repairing a defect in which material is missing. FIG. 7 shows a portion of a reflective photomask 12 in which material is missing from an area 46 of layer 26. Using the defective mask with material missing in area 46 will result in imprecise line widths or line spacings imaged onto the photoresist 16. A semiconductor device fabricated to include such imprecise line width may exhibit a short circuit, open circuit, improper circuit resistance or other operating parameter, or suffer from undesirable electromigration effects.

To repair the defective layer 26, at step 50 (see FIG. 5) material is to be deposited into the area 46. According to a preferred embodiment the fill material has the same reflectivity and phase response to a prescribed range of source light as the material forming layer 26. Thus, for a 160-170 nm lithographic process the fill material and layer 26 material have substantially the same reflectivity and phase response to 160-170 nm light. In a best mode embodiment, the same material is used for fill material as is used to form the defective layer 26. The fill material is deposited by a material deposition system 40. In alternate preferred embodiments the deposition system 40 includes either one of a laser source or an ion source. For the laser embodiment, the deposition system 40 implements a laser-assisted local deposition process. For the ion source embodiment, the deposition system implements an ion beam assisted local deposition process. In alternative deposition system 40 embodiments, local deposition is performed using a patterning or lift-off process.

FIGS. 8 and 9 show the reflective photomask 12 with fill material 52 deposited into the defect area 46. The material 52 is deposited to completely fill the area 46 of missing material. As shown in FIG. 9, the fill material overflows the defect area 46. During the deposition step, it is preferable that no gaps, no air or other gas pockets and no vacuum pockets remain between the fill material 52 and the layer 26 being repaired. More particularly, however, there are to be no gaps at the surface height d and no gaps down from the surface to a depth which the source light 32 may reach before being reflected.

At step 54, excess fill material 52 is trimmed to the edge dimensions of the layer 26 under repair. A trimming system 42 performs an etching process to remove the excess material. In alternate preferred embodiments a laser beam or focussed ion beam 45 (see FIG. 5) etches the excess deposited material. Referring to FIGS. 10 and 11, the side boundaries of the region 46 are shown trimmed to the dimensions of the layer 26 under repair. For a line embodiment of layer 26, the line width in the region of area 46 is restored to a desired line width substantially the same as that in adjacent portions of line 26.

At step 56, the repaired layer 26 is polished in the vicinity of the region 46 to bring the thickness of the fill material 52 to that of the adjacent layer 26 material. As shown in FIGS. 12 and 13, the polishing provides a smooth surface transition from the fill material 52 to the layer 26 material. In a preferred embodiment, the polishing step 56 is performed by a polishing system 44. The polishing system 44 smooths deposited material 52 by performing a chemical-mechanical polishing or other polishing process.

Although a preferred embodiment of the invention has been illustrated and described, various alternatives, modifications and equivalents may be used. For example, the method described also is applied to soft x-ray reflective photomasks used in lithographic semiconductor fabrication processes, such as extreme UV lithographic processes. Therefore, the foregoing description should not be taken as limiting the scope of the inventions which are defined by the appended claims.

What is claimed is:

1. A method for repairing a reflective photomask used in a lithographic semiconductor fabrication process, the photomask having a first area comprising a first material, wherein a first defect occurs in the first area, the first defect characterized as an indentation in the first area where material is missing, the method comprising the steps of:

depositing into the indentation characterizing the first defect a second material having substantially the same reflectivity and phase response under operating conditions of the lithographic semiconductor fabrication process as the first material; and planarizing the first area to provide a common surface profile between the second material and first material in the first area.

2. The method of claim 1 in which the first material and second material consist of the same material.

3. The method of claim 1, in which the step of depositing comprises laser assisted deposition.

4. The method of claim 1, in which the step of depositing comprises ion beam assisted deposition.

5. A method for repairing a reflective photomask used in a lithographic semiconductor fabrication process, the photomask having a first area comprising a first material, and wherein a first defect occurs in the first area, the first defect characterized as an indentation in the first area where material is missing, the method comprising the steps of:

depositing into the indentation characterizing the first defect a second material having substantially the same reflectivity and phase response under operating conditions of the lithographic semiconductor fabrication process as the first material;

trimming excess second material from the first area; and planarizing the first area to provide a common surface profile between the second material and first material in the first area.

6. The method of claim 5, in which the trimming step comprises focused ion beam milling.

7. A system for repairing a reflective photomask, the photomask used in a lithographic semiconductor fabrication process, the photomask having a first area comprising a first material, and wherein a first defect occurs in the first area, the first defect characterized as an indentation in the first area where material is missing, the system comprising:

means for depositing into the indentation characterizing the first defect a second material having substantially the same reflectivity and phase response under operating conditions of the lithographic semiconductor fabrication process as the first material; and means for planarizing the first area to provide a common surface profile between the second material and first material in the first area.

8. The system of claim 7, in which the first material and second material consist of the same material.

9. The system of claim 7, in which the depositing means comprises a laser for implementing laser assisted deposition.

10. The system of claim 7, in which the depositing means comprises an ion beam source for implementing ion beam assisted deposition.

11. The system of claim 7, further comprising means for trimming excess second material from the first area prior to polishing the first area.

12. The system of claim 11, in which the trimming means comprises an ion source for implementing focused ion beam milling.

13. A reflective photomask used in a lithographic semiconductor fabrication process, the photomask having a first area comprising a first material, and wherein a first defect occurring in the first area, characterized as an indentation in the first area where material is missing, has received a second material having substantially the same reflectivity and phase response under operating conditions of the lithographic semiconductor fabrication process as the first material; and wherein the first area is polished to provide a common surface profile between the second material and first material in the first area.

14. The reflective photomask of claim 13, in which the first material and second material consist of the same material.

\* \* \* \* \*

UNITED STATES PATENT AND TRADEMARK OFFICE
CERTIFICATE OF CORRECTION

PATENT NO. : 5,780,187
DATED : July 14, 1998
INVENTOR(S) : Pierrat

It is certified that error appears in the above-identified patent and that said Letters Patent is hereby corrected as shown below:

Column 1,
Line 4, insert -- <u>Government Rights:</u> This invention was made with United States Government support under Contract No. MDA972-92-C-0054 awarded by the Advanced Research Projects Agency (ARPA). The United States Government has certain rights in this invention. --;

Column 2,
Lines 39 and 54, after "phase" insert -- response --;

Column 3,
Line 30, after "wafer" insert -- substrate --;
Line 69, change "mask" to -- photomask --;

Column 4,
Line 27, change "light 37" to -- light 35 --;
Line 28, after "The light" insert -- 35 --;
Line 62, change "mask" to -- photomask --;
Line 69, change "step 50" to -- step 52 --;

Column 5,
Line 21, after "step" and before "," insert -- 40 --;
Line 26, change "source light 32" to -- light source 18 --;
Line 32, change "focussed" to -- focused --;
Lines 34 and 40, change "region 46" to -- area 46 --.

Signed and Sealed this

Eleventh Day of December, 2001

*Attest:*

*Nicholas P. Godici*

*Attesting Officer*

NICHOLAS P. GODICI
*Acting Director of the United States Patent and Trademark Office*